(12) United States Patent
Tay et al.

(10) Patent No.: US 7,863,102 B2
(45) Date of Patent: Jan. 4, 2011

(54) INTEGRATED CIRCUIT PACKAGE SYSTEM WITH EXTERNAL INTERCONNECTS WITHIN A DIE PLATFORM

(75) Inventors: Lionel Chien Hui Tay, Singapore (SG); Seng Guan Chow, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 220 days.

(21) Appl. No.: 12/036,056

(22) Filed: Feb. 22, 2008

(65) Prior Publication Data

US 2009/0212415 A1 Aug. 27, 2009

(51) Int. Cl.
*H01L 21/00* (2006.01)
*H01L 29/93* (2006.01)

(52) U.S. Cl. .............. 438/111; 257/673; 257/E23.037; 257/E21.51; 257/E23.043; 257/E21.502; 257/E23.066

(58) Field of Classification Search ............ 257/4, 257/72, 81, 91, 98–100, 144, 150–153, 175–179, 257/181, 182, 203, 207–211, 246–250, 276, 257/382–385, 401, 418, 433, 434, 448, 457, 257/459, 502, 503, 508, 522, 534, 554, 573, 257/282–284, 309, 317, 377, 576, 584, 587, 257/673, 602, 123, 121, E21.506, E21.51, 257/E21.502, E23.031, E23.032, E23.037, 257/E23.01, E23.014, E23.04; 438/611, 438/111; 257/E23.043, E23.06, E23.066
See application file for complete search history.

(56) References Cited

U.S. PATENT DOCUMENTS

| 5,107,328 | A | 4/1992 | Kinsman | |
|---|---|---|---|---|
| 5,200,809 | A | 4/1993 | Kwon | |
| 5,986,209 | A | 11/1999 | Tandy | |
| 6,081,029 | A * | 6/2000 | Yamaguchi | 257/718 |
| 6,535,388 | B1 | 3/2003 | Garcia | |
| 2002/0190377 | A1* | 12/2002 | Igarashi et al. | 257/738 |
| 2003/0197262 | A1* | 10/2003 | Huang et al. | 257/686 |
| 2005/0208701 | A1* | 9/2005 | Jeong et al. | 438/106 |
| 2005/0224918 | A1* | 10/2005 | Kobayashi et al. | 257/600 |
| 2006/0255436 | A1* | 11/2006 | Ozawa | 257/666 |
| 2008/0012100 | A1 | 1/2008 | Punzalan et al. | |
| 2009/0001554 | A1* | 1/2009 | Otremba | 257/708 |
| 2009/0020861 | A1* | 1/2009 | Otremba | 257/676 |

* cited by examiner

*Primary Examiner*—Caridad M Everhart
(74) *Attorney, Agent, or Firm*—Mikio Ishimaru

(57) ABSTRACT

The present invention provides an integrated circuit package system comprising: attaching a die platform to an integrated circuit die; mounting the integrated circuit die over an external interconnect with a bottom side of the external interconnect partially within the die platform; connecting the integrated circuit die and the external interconnect; and forming an encapsulation over the integrated circuit die with the external interconnect partially exposed.

20 Claims, 3 Drawing Sheets

INTEGRATED CIRCUIT PACKAGE SYSTEM WITH EXTERNAL INTERCONNECTS WITHIN A DIE PLATFORM

TECHNICAL FIELD

The present invention relates generally to an integrated circuit package system and more particularly to an integrated circuit package system with encapsulation.

BACKGROUND ART

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor die (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact terminals or pads formed directly on the surface of the package.

Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the quad flat package ("QFP"). QFP packages typically comprise a lead frame, such as a conductive sheet stamped and etched, with a semiconductor die having a multitude of bond pads mounted to the top side of the lead frame. Wire bonds electrically connect the bond pads, of the semiconductor die, to a series of conductive lead fingers on the topside of the lead frame. Typically, the semiconductor die and the wire bonds are encapsulated within a molding compound.

In order to reduce manufacturing costs, the electronics industry is increasing the usage of QFP packages. In the manufacturing process, many obstacles must be overcome to deliver extremely small packages with thinner and thinner profile in high volume. Despite the trend towards miniaturization and thinner profile, more functions and more integrated circuits are continued to be packed into QFP packages.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: attaching a die platform to an integrated circuit die; mounting the integrated circuit die over an external interconnect with a bottom side of the external interconnect partially within the die platform; connecting the integrated circuit die and the external interconnect; and forming an encapsulation over the integrated circuit die with the external interconnect partially exposed.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
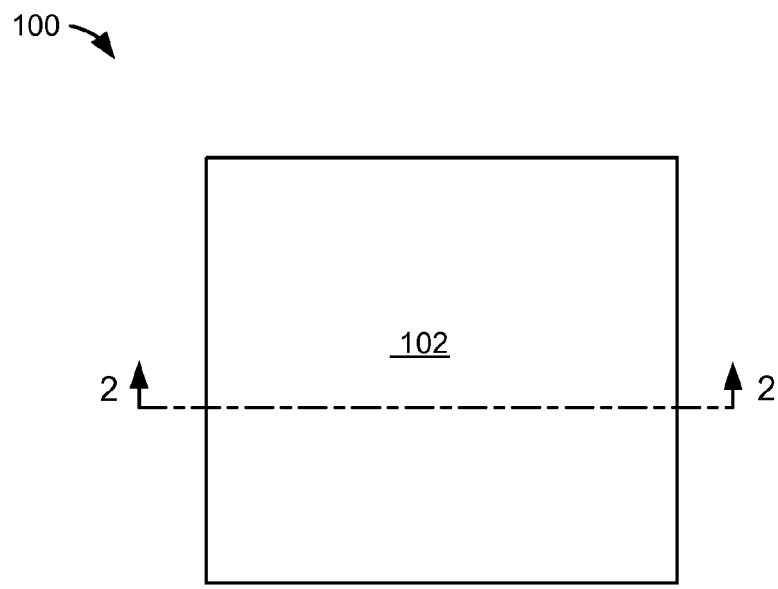
FIG. 1 is a top plan view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing figures. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, or removal of the material or as required in forming a described structure. The term "system" as used herein means and refers to the method and to the apparatus of the present invention in accordance with the context in which the term is used.

Referring now to FIG. 1, therein is shown a top plan view of an integrated circuit package system 100 in a first embodiment of the present invention. The top view depicts an encapsulation 102 of the integrated circuit package system 100.

Figure 2:
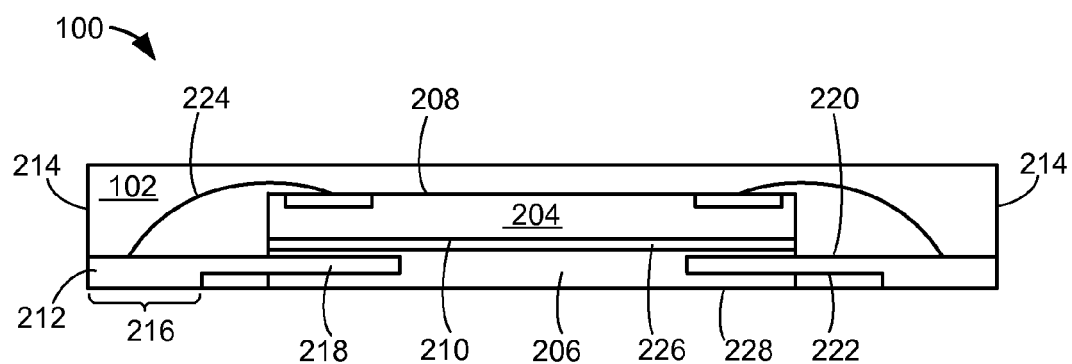
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts an integrated circuit die 204, mounted over a die platform 206, such as a lead-in-film comprising a non-conductive, B-stage material that acts as an adhesive when cured. The integrated circuit die 204 includes an active side 208 and a non-active side 210, wherein the active side 208 includes active circuitry fabricated thereon. Preferably, the integrated circuit die 204 is mounted to the die platform 206 with the non-active side 210 facing the die platform 206.

External interconnects 212 are provided along each encapsulation side 214 of the encapsulation. Each of the external interconnects 212 includes a body 216 and tip 218. The tip 218 includes a top side 220 and a bottom side 222, with preferably the top side 220 and the bottom side 222 within the die platform 206. The die platform 206 is mounted over the external interconnects 212 such that the top side 220 and the bottom side 222 of the tip 218 of each of the external interconnects 212 is within the die platform 206 and adheres thereto.

An internal interconnect 224, such as a bond wire, connected between the active side 208 and the external interconnects 212 provides electrical connection between the active side 208 and the external interconnects 212. The encapsulation 102 is formed over the integrated circuit die 204, the die platform 206, the internal interconnect 224, exposing a bottom platform side 228, and partially exposing the external interconnects 212. Preferably, the body 216 is partially exposed for electrical connection to the next level system, such as a printed circuit board.

Optionally, a barrier layer 226, also of a non-conductive material, may be provided between the integrated circuit die 204 and the die platform 206 to prevent any plating material from the external interconnects 212 from migrating to the integrated circuit die 204. The non-conductivity of the barrier layer 226 further reduces the likelihood of contact between the integrated circuit die 204 and the external interconnects 212.

It has been discovered that the adhesive quality of the die platform provides a lead-locking feature to prevent movement of the external interconnects during wire bonding. The die platform thereby improves the reliability and yield during the manufacturing process of the integrated circuit package system. The die platform also eliminates the need for a customized heater block, reducing manufacturing cost. The non-conductive material of the die platform acts as a barrier to prevent plating material migrating from the external interconnects to the integrated circuit die, minimizing the need for any additional protective layers between the integrated circuit die and the external interconnects.

Figure 3:
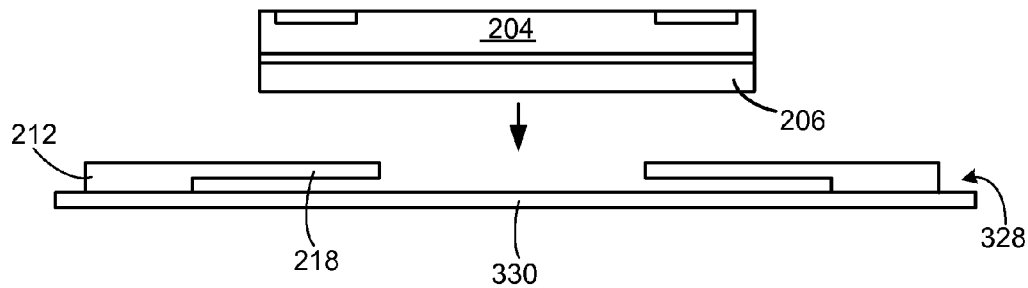
FIG. 3 is a cross-sectional view of a die platform with an integrated circuit die mounting to the external interconnects.

Referring now to FIG. 3, therein is shown a cross-sectional view of an intermediate structures comprising a lead frame 328 with the external interconnects 212 of the integrated circuit package system 100 of FIG. 2 attached to a lead frame tape 330. The die platform 206 with the integrated circuit die 204 is shown being mounted to the tip 218 of each of the external interconnects 212. Generally, the die platform 206 can be mounted through the lead frame 328 including the external interconnects 212 and, in at least one embodiment, the die platform 206 can be mounted through the tip 218 of the external interconnects 212.

Figure 4:
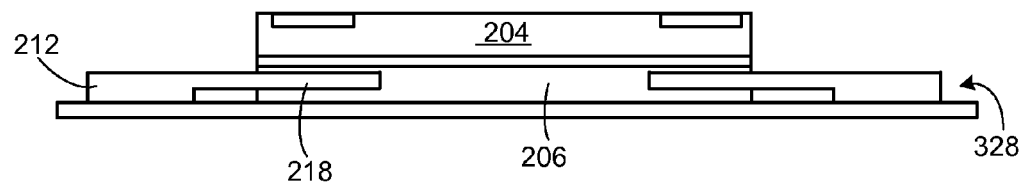
FIG. 4 is a cross-sectional view of the structure of FIG. 3 in a curing phase of the die platform.

Referring now to FIG. 4, therein is shown a cross-sectional view of the structure of FIG. 3 in a curing phase of the die platform 206. The die platform 206 surrounds and adheres to the tip 218 of each of the external interconnects 212, such that the tip 218 is adhered within the die platform 206. The die platform 206 therefore provides a lead-locking feature to reduce the external interconnects 212 from bouncing or shifting during the wire bonding process.

Figure 5:
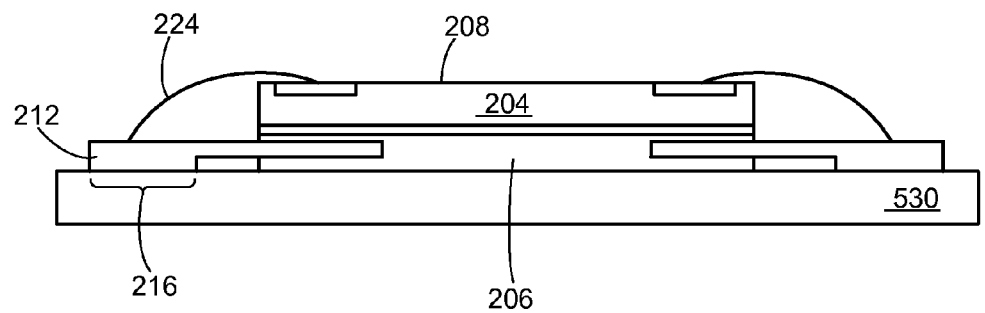
FIG. 5 is a cross-sectional view of the structure of FIG. 4 in a connecting phase of the integrated circuit die.

Referring now to FIG. 5, therein is shown a cross-sectional view of the structure of FIG. 4 in a connecting phase of the integrated circuit die 204. The structure of FIG. 4 with the lead frame tape 330 removed is placed on a heater block 530 for stability during the connecting phase. The internal interconnect 224, such as a bond wire, is connected between the active side 208 and the body 216 of the external interconnects 212. The heater block 530 can be planar and need not be positive-biased type or customized to support the integrated circuit die 204 and the die platform 206 during the wire bonding process. This minimizes the manufacturing cost and requirements to have customized heater blocks to support the integrated circuit die for wire bonding.

Figure 6:
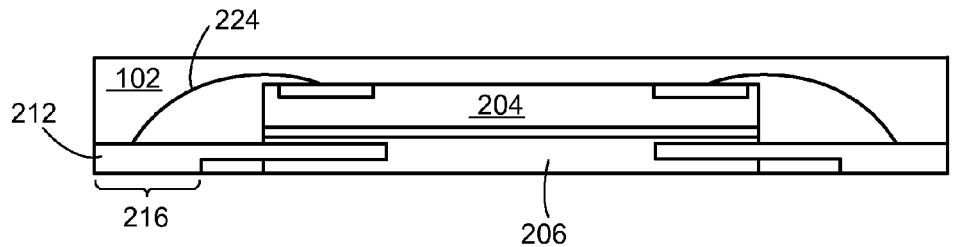
FIG. 6 is a cross-sectional view of the structure of FIG. 5 in a forming phase of the encapsulation of the integrated circuit package system.

Referring now to FIG. 6, therein is shown a cross-sectional view of the structure of FIG. 5 in a forming phase of the encapsulation 102 of the integrated circuit package system 100 of FIG. 2. The encapsulation 102 is formed over the integrated circuit die 204, the die platform 206, the external interconnects 212, the internal interconnect 224, and exposing a bottom platform side. The lead frame 328 of FIG. 3 is singulated and the body 216 of each of the external interconnects 212 is partially exposed by the encapsulation 102 for electrical connection to the next system level, such as a printed circuit board.

Figure 7:
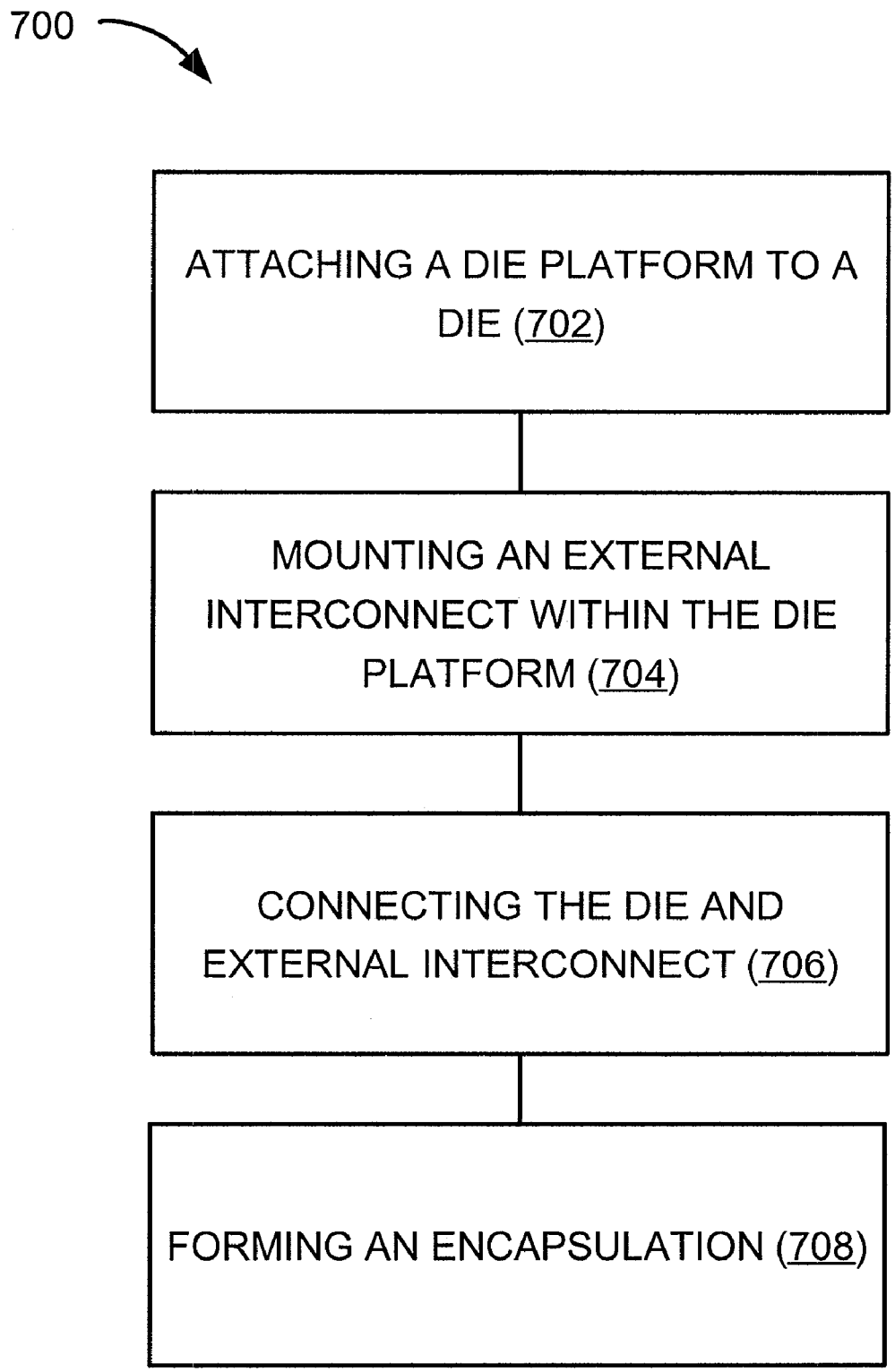
FIG. 7 is a flow chart of an integrated circuit package system for manufacturing of the integrated circuit package system of FIG. 1 in an embodiment of the present invention.

Referring now to FIG. 7, therein is shown a flow chart of an integrated circuit package system 700 for manufacturing of the integrated circuit package system 100 of FIG. 1 in an embodiment of the present invention. The system 700 comprises: attaching a die platform to an integrated circuit die in a block 702; mounting the integrated circuit die over an external interconnect with a bottom side of the external interconnect partially within the die platform in a block 704; connecting the integrated circuit die and the external interconnect in a block 706; and forming an encapsulation over the integrated circuit die with the external interconnect partially exposed in a block 708.

It has been discovered that the present invention provides an integrated circuit package system having improved reliability and manufacturing yields. The configuration of the die platform reduces manufacturing costs such as eliminating the need for a customized heater block during manufacturing of the integrated circuit package system. The die platform also provides a lead-locking feature reducing movement of the external interconnects, or leads, during wire bonding to increase manufacturing reliability and yield.

Yet another important aspect of the present invention is that it valuably supports and services the historical trend of reducing costs, simplifying systems, and increasing performance. These and other valuable aspects of the present invention consequently further the state of the technology to at least the next level.

Thus, it has been discovered that the mountable integrated circuit package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
    attaching a die platform to an integrated circuit die;
    mounting the die platform through an external interconnect with a bottom side of the external interconnect partially within the die platform;
    connecting the integrated circuit die and the external interconnect; and
    forming an encapsulation over the integrated circuit die with the external interconnect partially exposed.

2. The method as claimed in claim 1 wherein forming the encapsulation over the integrated circuit die includes exposing the die platform.

3. The method as claimed in claim 1 wherein mounting the integrated circuit die includes adhering a tip of the external interconnect to the die platform.

4. The method as claimed in claim 1 wherein forming the encapsulation over the integrated circuit die includes exposing the die platform coplanar with the external interconnect.

5. The method as claimed in claim 1 further comprising forming a barrier layer between the integrated circuit die and the die platform.

6. A method of manufacture of an integrated circuit package system comprising:
    attaching a die platform comprising a first non-conductive material to an integrated circuit die;
    mounting the die platform through an external interconnect having a body and a tip, with a bottom side of the tip partially within the die platform;
    connecting an internal interconnect between the integrated circuit die and the external interconnect; and
    forming an encapsulation over the integrated circuit die with the external interconnect partially exposed.

7. The method as claimed in claim 6 wherein forming the encapsulation includes forming the encapsulation over the integrated circuit die with a bottom platform side of the die platform exposed.

8. The method as claimed in claim 6 wherein connecting the internal interconnect includes:
    removing a lead frame tape from the external interconnects; and
    mounting the integrated circuit with the die platform over a non-biased heater block.

9. The method as claimed in claim 6 wherein forming the encapsulation includes forming the encapsulation over the integrated circuit die partially exposing the body of the external interconnect.

10. The method as claimed in claim 6 wherein attaching the die platform includes attaching the die platform to a non-active side of the integrated circuit die facing the die platform.

11. An integrated circuit package system comprising:
    a die platform attached with an integrated circuit die;
    a lead frame including an external interconnect mounted to the integrated circuit die, with a bottom side of the external interconnect partially within the die platform;
    an internal interconnect connected between the integrated circuit die and the external interconnect; and
    an encapsulation formed over the integrated circuit die partially exposing the external interconnect.

12. The system as claimed in claim 11 wherein the encapsulation exposes the die platform.

13. The system as claimed in claim 11 wherein a tip of the external interconnect is adhered to the die platform.

14. The system as claimed in claim 11 wherein the encapsulation includes the die platform exposed coplanar with the external interconnect.

15. The system as claimed in claim 11 further comprising a barrier layer formed between the integrated circuit die and the die platform.

16. The system as claimed in claim 11 wherein:
    the die platform comprises a first non-conductive material layer; and
    the external interconnect includes a body and a tip, the bottom side of the tip partially within the die platform.

17. The system as claimed in claim 16 wherein the encapsulation includes exposing a bottom platform side of the die platform.

18. The system as claimed in claim 16 wherein a top side of the tip faces the integrated circuit die.

19. The system as claimed in claim 16 wherein the encapsulation partially exposes the body.

20. The system as claimed in claim 16 wherein a non-active side of the integrated circuit die faces the die platform.

* * * * *